United States Patent
Jang et al.

(10) Patent No.: US 8,108,709 B2
(45) Date of Patent: Jan. 31, 2012

(54) OUTPUT ENABLE SIGNAL GENERATION CIRCUIT FOR SEMICONDUCTOR MEMORY DEVICE

(75) Inventors: Ji-Eun Jang, Gyeonggi-do (KR); Seok-Cheol Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 662 days.

(21) Appl. No.: 12/326,572

(22) Filed: Dec. 2, 2008

(65) Prior Publication Data

US 2009/0322387 A1   Dec. 31, 2009

(30) Foreign Application Priority Data

Jun. 30, 2008   (KR) .................. 10-2008-0063139

(51) Int. Cl.
*G06F 1/04* (2006.01)
(52) U.S. Cl. ...................................... 713/502
(58) Field of Classification Search .......... 713/500–503; 711/167
See application file for complete search history.

(56) References Cited

U.S. PATENT DOCUMENTS

| | | | |
|---|---|---|---|
| 5,402,388 A * | 3/1995 | Wojcicki et al. ......... 365/233.17 |
| 6,157,992 A * | 12/2000 | Sawada et al. .............. 711/167 |
| 6,446,180 B2 | 9/2002 | Li et al. |
| 6,738,309 B2 * | 5/2004 | Benedix et al. ............ 365/233.1 |
| 6,977,848 B2 | 12/2005 | Choi et al. |
| 6,982,924 B2 | 1/2006 | Na et al. |
| 6,987,705 B2 | 1/2006 | Kim et al. |
| 7,027,336 B2 | 4/2006 | Lee et al. |
| 7,081,784 B2 | 7/2006 | Kang et al. |
| 7,308,594 B2 * | 12/2007 | Janzen .......................... 713/401 |
| 7,958,382 B2 * | 6/2011 | Kim et al. ..................... 713/500 |

FOREIGN PATENT DOCUMENTS

| | | |
|---|---|---|
| JP | 2004-327008 | 11/2004 |
| KR | 1020060075509 A | 7/2006 |
| KR | 1020070036563 A | 4/2007 |
| KR | 1020070056505 A | 6/2007 |
| KR | 1020080039076 A | 5/2008 |

OTHER PUBLICATIONS

Notice of Allowance issued from Korean Intellectual Property Office on Dec. 3, 2009.

* cited by examiner

*Primary Examiner* — Paul R Myers
(74) *Attorney, Agent, or Firm* — IP & T Group LLP

(57) ABSTRACT

A circuit for generating an output enable signal includes a reset signal generator for synchronizing a reset signal with an external clock signal to generate an output enable (OE) reset signal, synchronizers for synchronizing the OE reset signal with an internal clock signal to generate a source reset signal, and an output enable signal output unit, reset by the source reset signal, for counting pulses of the external clock signal and the internal clock signal to output an output enable signal corresponding to a read command and CAS latency.

8 Claims, 3 Drawing Sheets

OUTPUT ENABLE SIGNAL GENERATION CIRCUIT FOR SEMICONDUCTOR MEMORY DEVICE

CROSS-REFERENCE TO RELATED APPLICATION

The present invention claims priority of Korean patent application number 10-2008-0063139, filed on Jun. 30, 2008, which is incorporated by reference in its entirety.

BACKGROUND OF THE INVENTION

The present invention relates to a semiconductor design technology, and more particularly, to a circuit for generating an output enable signal corresponding to CAS latency.

Semiconductor memory devices, including Double Data Rate Synchronous DRAM (DDR SDRAM), generally receive a read command from outside in response to an external clock signal and output data stored therein to the outside in response to an internal clock signal. When data is to be outputted, the semiconductor memory device processes the data using the internal clock signal, not the external clock signal. Here, the read command is inputted in synchronization with the external clock signal, while the data is outputted in synchronization with the internal clock signal. Therefore, the semiconductor memory devices should include a circuit for synchronizing the read command synchronized with the external clock signal with the internal clock signal. In view of the read command, the clock signal for synchronization is changed from the external clock signal to the internal clock signal, and this operation is generally called 'domain crossing'.

Meanwhile, the semiconductor memory device is provided with an output enable signal generation circuit which performs domain crossing on the read command from the external clock signal to the internal clock signal, and generates an output enable signal depending on CAS latency information. The output enable signal is to ensure an operation that outputs data in response to the external clock signal when the read command is applied and after accounting for CAS latency. Since this signal is subjected to domain crossing, it becomes synchronized with the internal clock signal. Typically, CAS latency is stored in a mode register set provided in the semiconductor memory device, and has information indicating that the read command is applied in one cycle unit of the external clock signal and on whether data is to be outputted at what point of the external clock signal.

Further, the semiconductor memory device is provided with a Delay Locked Loop (DLL) for generating an internal clock signal, and a DLL clock signal with which the output enable signal is synchronized.

FIG. 1 is a block diagram showing a conventional output enable signal generation circuit for a semiconductor memory device. Referring to FIG. 1, the conventional output enable signal generation circuit includes an OE reset signal generator 110, a reset signal synchronizer 130, and an output enable signal output unit 150. The OE reset signal generator 110 synchronizes a reset signal RSTb with an external clock signal CLK_EXT to generate an OE reset signal RSTb_OE. Here, the reset signal RSTb is activated in response to an active operation of a semiconductor memory device, a locking operation of a DLL, and a setting operation of a mode register set. The reset signal synchronizer 130, designed with a D-flip flop, synchronizes the OE reset signal RSTb_OE with a DLL clock signal CLK_DLL to generate a source reset signal RSTb_SRC that resets the output enable signal output unit 150. The output enable signal output unit 150 is reset in response to the source reset signal RSTb_SRC, counts the external clock signal CLK_EXT and the DLL clock signal CLK_DLL to output an output enable signal OE corresponding to a read command signal RD_EN and CAS latency CL. Here, the read command signal RD_EN is a pulse signal which is activated when the read command for the semiconductor memory device is applied, and after the output enable signal output unit 150 is reset in response to the source reset signal RSTb_SRC. Thus, the output enable signal output unit 150 can generate the output enable signal OE corresponding to the read command signal RD_EN and the CAS latency CL only when the source reset signal RSTb_SRC is normally activated at a desired time.

In other words, the output enable signal output unit 150 can perform a stable operation only when the OE reset signal RSTb_OE that is outputted in synchronization with the external clock signal CLK_EXT by the OE reset signal generator 110 is outputted exactly in synchronization with the DLL clock signal CLK_DLL by the reset signal synchronizer 130. In the conventional output enable signal generation circuit, however, the source reset signal RSTb_SRC may not be synchronized with the DLL clock signal CLK_DLL.

FIGS. 2A and 2B are waveform diagrams for explaining an operation timing of an OE reset signal RSTb_OE and a DLL clock signal CLK_DLL. That is, FIG. 2A is a waveform diagram when a source reset signal RSTb_SRC is normally generated and FIG. 2B is a waveform diagram when the source reset signal RSTb_SRC is abnormally generated. For reference, tD1 and tD2 in FIGS. 2A and 2B indicate the degree of delay reflected in a DLL upon completion of locking. That is, tD1 indicates the degree of delay reflected in a variable delay circuit provided in the DLL and tD2 represents the degree of delay reflected in a delay replica model circuit provided in the DLL. In the same semiconductor memory device, tD2 is constant, while tD1 varies depending on an operating frequency.

Referring to FIGS. 1 and 2A, the OE reset signal RSTb_OE is synchronized and outputted in response to the external clock signal CLK_EXT by the OE reset signal generator 110. In FIG. 2A, there is a sufficiently secured setup time (ⓐ) between the time the OE reset signal RSTb_OE transits from logic 'low' to logic 'high' and a rising edge of the DLL clock signal RCLK_DLL. Because of this, the reset signal synchronizer 130 stably synchronizes the OE reset signal RSTb_OE with the DLL clock signal CLK_DLL to output the source reset signal RSTb_SRC. As a result, the source reset signal RSTb_SRC synchronized with the DLL clock signal CLK_DLL ensures that the output enable signal output unit 150 can stably operate thereafter.

Meanwhile, referring to FIGS. 1 and 2B, the OE reset signal RSTb_OE is synchronized and outputted in response to the external clock signal CLK_EXT, as shown in FIG. 2A. In FIG. 2B, there is an insufficiently secured setup time (ⓑ) between a transition time of the OE reset signal RSTb_OE and a rising edge of the DLL clock signal RCLK_DLL. Due to this, the reset signal synchronizer 130 does not stably synchronize the OE reset signal RSTb_OE with the DLL clock signal CLK_DLL. In result, this means that it is difficult to ensure that the output enable signal output unit 150 can stably operate thereafter.

As mentioned above, since the OE reset signal RSTb_OE and the DLL clock signal RCLK_DLL, which are activated in synchronization with the external clock signal CLK_EXT, do not secure a sufficient setup time, the conventional output enable signal generation circuit cannot ensure a stable operation of the output enable signal output unit 150. This means that the output enable signal output unit 150 cannot be reset at a desired time, and cannot generate an output enable signal OE corresponding to the read command signal RD_EN and the CAS latency CL. In other words, the semiconductor memory device cannot output desired data when the read command is applied and after the CAS latency CL.

SUMMARY OF THE INVENTION

An embodiment of the present invention is directed to a circuit for generating an output enable signal generation circuit for a semiconductor memory device, which is capable of generating, as a source reset signal, an OE reset signal that is reliably synchronized with a DLL clock signal. A method according to the invention generates an output enable signal corresponding to a read command and CAS latency, even when an OE reset signal and a DLL clock signal, which are activated in synchronization with an external clock signal, do not secure a sufficient setup time.

In accordance with the invention a circuit for generating an output enable signal includes a reset signal generator for synchronizing a reset signal with an external clock signal to generate an output enable (OE) reset signal. A plurality of synchronizers synchronize the OE reset signal with an internal clock signal at least two times to generate a source reset signal. An output enable signal output unit is reset in response to the source reset signal and counts pulses of each of the external clock signal and the internal clock signal to output an output enable signal corresponding to a read command and CAS latency.

In accordance with the invention, a method for generating an output enable signal includes synchronizing a reset signal with an external clock signal to generate an output enable (OE) reset signal, synchronizing the OE reset signal a first time in response to an internal clock signal, and synchronizing the OE reset signal a second time slower than the first time in response to the internal clock signal, to generate a source reset signal. The method further includes counting pulses of the external clock signal and the internal clock signal, and generating an output enable signal corresponding to a read command and a predetermined CAS latency, wherein the counting is reset by the source reset signal.

In accordance with the invention, an OE reset signal can be synchronized with a DLL clock signal that is an internal clock signal at least two times to generate a source reset signal, thereby removing a problem that the source reset signal was not synchronized with the DLL clock signal. Accordingly, an output enable signal that is generated based on the source reset signal can be stably activated to correspond to a read command and CAS latency.

DESCRIPTION OF SPECIFIC EMBODIMENTS

Figure 1:
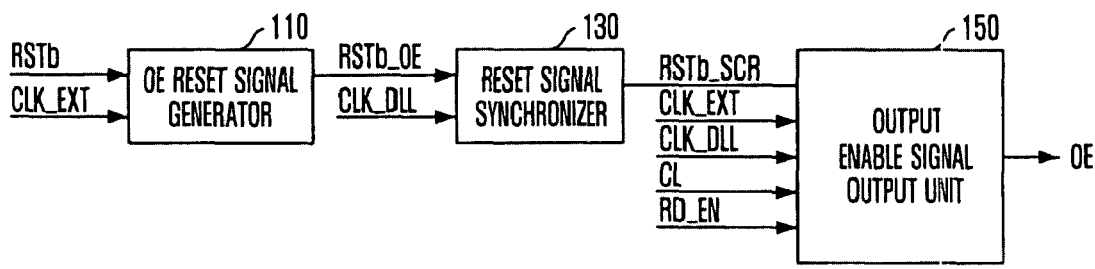
FIG. 1 is a block diagram showing a conventional output enable signal generation circuit for a semiconductor memory device.
Figure 2A:
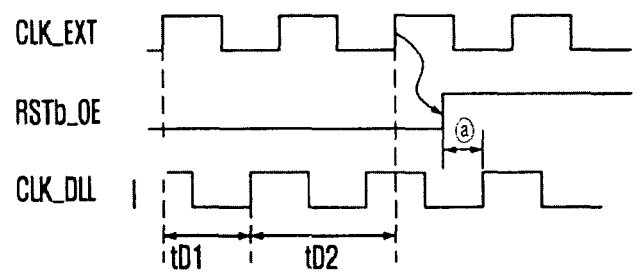
FIGS. 2A and 2B are waveform diagrams explaining an operation timing of an OE reset signal RSTb_OE and a DLL clock signal CLK_DLL.
Figure 2B:
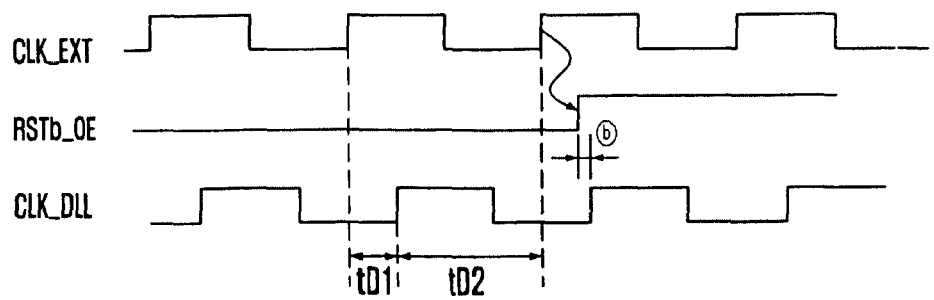
Figure 3:
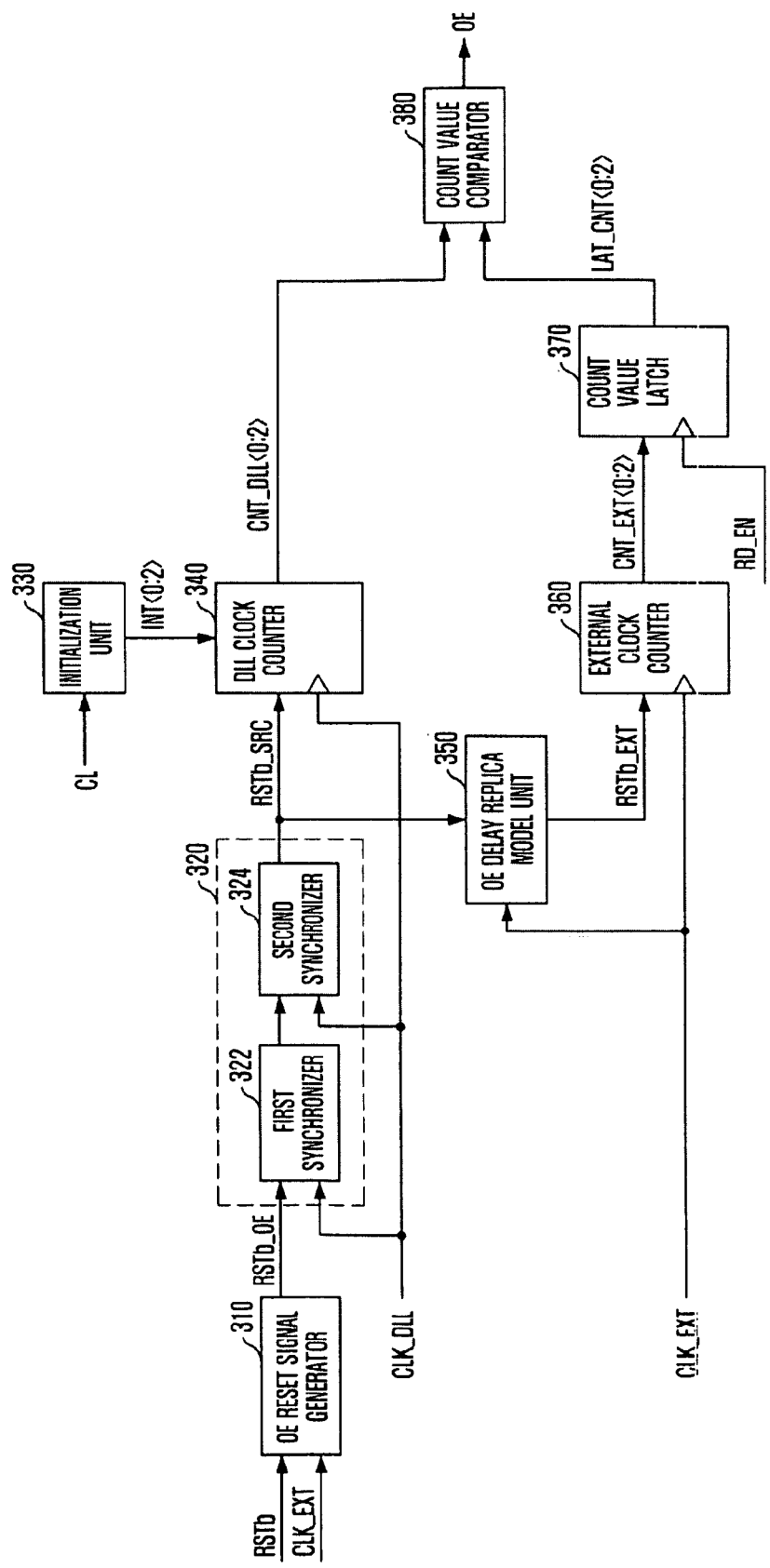
FIG. 3 is a block diagram illustrating an output enable signal generation circuit for a semiconductor memory device in accordance with an embodiment of the present invention.

Hereinafter, a preferred embodiment of the present invention will be described in detail with reference to the accompanying drawings so that the invention can be easily practiced by those skilled in the art. FIG. 3 is a block diagram illustrating an output enable signal generation circuit for a semiconductor memory device in accordance with an embodiment of the invention. Referring to FIG. 3, the output enable signal generation circuit includes an OE reset signal generator 310, a plural of synchronizers 320, an initialization unit 330, a DLL clock counter 340, an OE delay replica model unit 350, an external clock counter 360, a count value latch 370, and a count value comparator 380.

The OE reset signal generator 310 synchronizes a reset signal RSTb with an external clock signal CLK_EXT to generate an OE reset signal RSTb_OE. Here, the reset signal RSTb is a signal that is activated in response to an active operation of a semiconductor memory device, a locking completion operation of a DLL, and a setting operation of a mode register set.

The synchronizers 320 synchronize the OE reset signal RSTb_OE with the DLL clock signal CLK_DLL at least two times, to generate a first reset signal RSTb_SRC as a source to reset the DLL clock counter 340 and the external clock counter 360. To this end, they are composed of a first synchronizer 322 and a second synchronizer 324.

Here, the first synchronizer 322 synchronizes the OE reset signal RSTb_OE with the DLL clock signal CLK_DLL that is an internal clock signal for its output, and the second synchronizer 324 synchronizes an output signal from the first synchronizer 322 with the DLL clock signal CLK_DLL to output the first reset signal RSTb_SRC. While this embodiment includes the first and the second synchronizers 322 and 324 of two, it may include three or more synchronizers depending on the design thereof. Further, each of the synchronizers may be designed with a D-flip flop for outputting an input signal thereto in response to the DLL clock signal CLK_DLL being inputted as a reference for synchronization.

As mentioned earlier, in case where the OE reset signal RSTb_OE and the DLL clock signal CLK_DLL do not secure a setup time, the convention output enable signal generation circuit had a problem that a source reset signal (corresponding to the first reset signal RSTb_SRC of the invention) is outputted, without being exactly synchronized with the DLL clock signal CLK_DLL at a desired time. On the contrary, the output enable signal generation circuit of the present invention is provided with the synchronizers 322 and 324, thereby removing the above problem.

That is, the first synchronizer 322 out of the synchronizers 320 synchronizes the OE reset signal RSTb_OE with the DLL clock signal CLK_DLL to output it to the second synchronizer 324. At this time, there occurs a circumstance that the OE reset signal RSTb_OE and the DLL clock signal CLK_DLL do not secure a setup time. Therefore, the first synchronizer 322 can generate an output signal that is not correctly synchronized with the DLL clock signal CLK_DLL. However, a sufficient margin arises between the output signal from the first synchronizer 322 and the DLL clock signal CLK_DLL in view of the second synchronizer 324, so the second synchronizer 324 can synchronize the output signal from the first synchronizer 322 with DLL clock signal CLK_DLL once again. In result, the first reset signal RSTb_SRC outputted from the synchronizers 320 can be synchronized with the DLL clock signal CLK_DLL and then outputted.

Meanwhile, the initialization unit 330 can provide the DLL clock counter 340 with an initial count value INT<0:2> corresponding to CAS latency. Here, the initial count value INT<0:2> is set to a 3-bit code signal for example. Table 1 below shows that, when CAS latency CL is 3 to 6, an initial count setting value set by the initialization unit 330 and its corresponding initial count value outputted from the initialization unit 330 are presented.

TABLE 1

| CL | Initial count setting value | INT <2> | INT <1> | INT <0> |
|----|----|----|----|----|
| 3 | 5 | 1 | 0 | 1 |
| 4 | 4 | 1 | 0 | 0 |
| 5 | 3 | 0 | 1 | 1 |
| 6 | 2 | 0 | 1 | 0 |

For reference, the CAS latency CL, and its corresponding initial count setting value and initial count value INT<0:2> in Table 1 may vary depending on the design thereof.

The DLL clock counter 340 can perform a counting operation in response to the first reset signal RSTb_SRC. That is, it can output a DLL clock count value CNT_DLL<0:2> counted from the initial count value INT<0:2> depending on the first reset signal RSTb_SRC in response to the DLL clock signal CLK_DLL. For example, if the initial count value INT<0:2> is set to 4 depending on the CAS latency, the DLL clock counter 340 outputs the DLL count value CNT_DLL<0:2> counted from 4 in response to the DLL clock signal CLK_DLL. Here, the DLL clock counter 340 uses a typical 3-bit counter by way of example.

The OE delay replica model unit 350 models an amount of delay between the DLL clock signal CLK_DLL and the external clock signal CLK_EXT. That is, it delays the first reset signal by a modeled amount of delay and synchronizes a delayed signal with the external clock signal CLK_EXT to generate a second reset signal RSTb_EXT. Here, the amount of delay modeled by the OE delay replica model unit 350 is similar to that modeled by a delay replica model circuit provided in a DLL (not shown).

The external clock counter 360 can perform a counting operation in response to the second reset signal RSTb_EXT. That is, it can output an external clock count value CNT_EXT<0:2> counted depending on the second reset signal RSTb_EXT in response to the external clock signal CLK_EXT. The external clock counter 360 has an initial count value set as 0, unlike the DLL clock counter 340. In other words, the external clock counter 360 outputs the external clock count value CNT_EXT<0:2> counted from 0 in response to the external clock signal CLK_EXT. Here, the external clock counter 360 uses a typical 3-bit counter like the DLL clock counter 340 by way of example.

The count value latch 370 latches the external clock count value CNT_EXT<0:2> in response to the read command signal RD_EN to output a latched external clock count value LAT_EXT<0:2>. Here, the read command signal RD_EN is a pulse signal which is activated in response to a read command that is inputted in synchronization with the external clock signal CLK_EXT.

The count value comparator 380 compares the DLL clock count value CNT_DLL<0:2> with the latched external clock count value LAT_CNT<0:2> to produce an output enable signal OE being activated at the time the two values become the same. Here, the count value comparator 380 adopts a general comparator for example. And the output enable signal OE is synchronized with the DLL clock signal CLK_DLL and is the result that is obtained by synchronizing the read command that is inputted in synchronization with the external clock signal CLK_EXT with the DLL clock signal CLK_DLL. At this time, the output enable signal OE reflects the CAS latency, details of which will be given with reference to FIG. 4 below.

For the convenience of explanation, the components, including the initialization unit 330, the DLL clock counter 340, the OE delay replica model unit 350, the external clock counter 360, the count value latch 370, and the count value comparator 380, will be collectively referred to as an "output enable signal output unit" below. The output enable signal output unit is reset in response to the first reset signal RSTb_SRC from the synchronizers 320, and counts the external clock signal CLK_EXT and the DLL clock signal CLK_DLL, respectively, to output an output enable signal OE corresponding to the read command signal RD_EN and the CAS latency CL.

Meanwhile, the synchronizers 320 provided in the present invention can reliably generate the first reset signal RSTb_SRC that is synchronized with the DLL clock signal CLK_DLL. Then, the output enable signal output unit can operate based on the first reset signal RSTb_SRC. Therefore, the following operation timing will be discussed under the premise that the first reset signal RSTb_SRC is outputted in synchronization with the DLL clock signal CLK_DLL.

Figure 4:
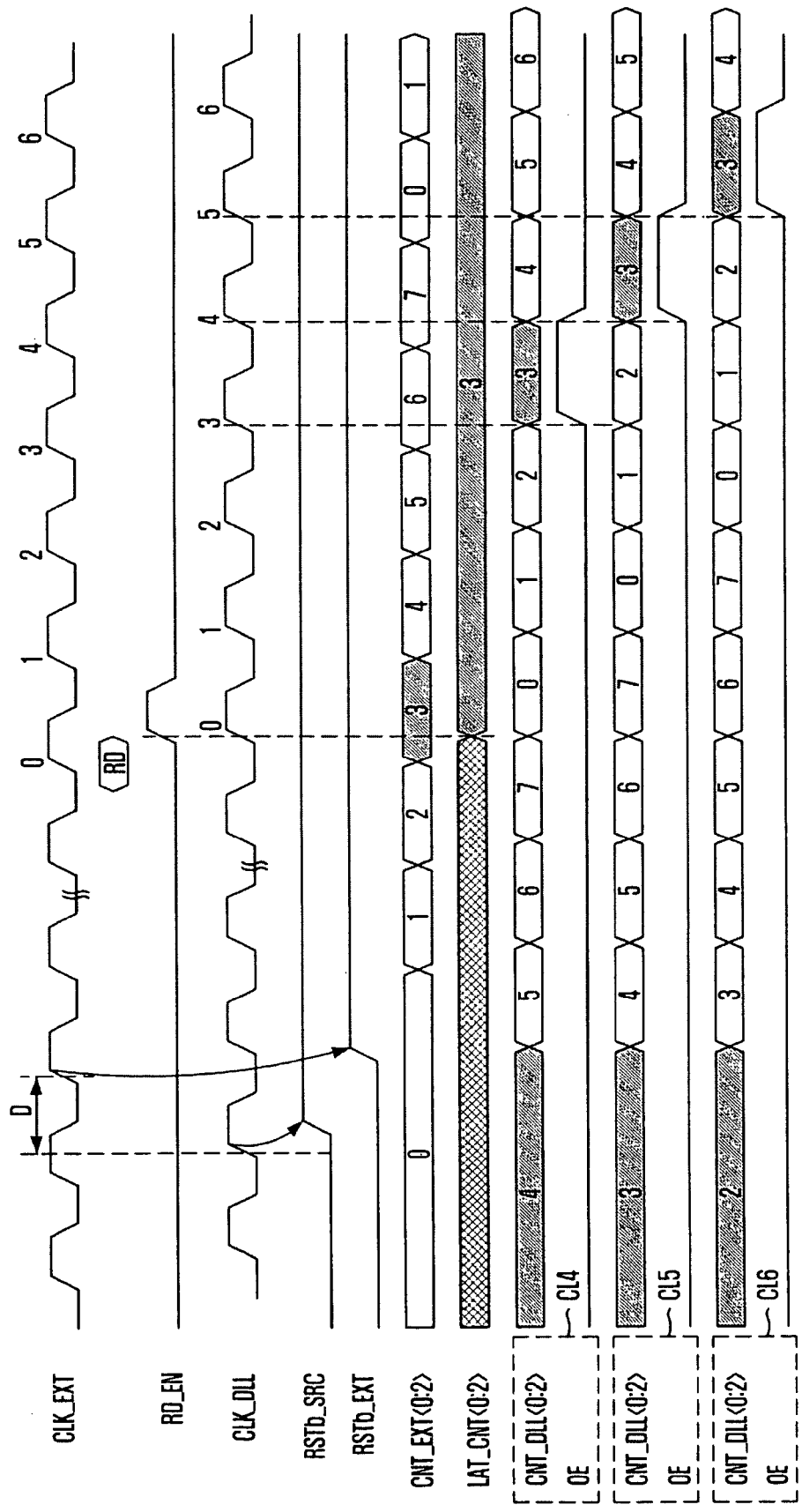
FIG. 4 is a waveform diagram for explaining a brief operation timing of the output enable signal output unit shown in FIG. 3.

FIG. 4 is a waveform diagram describing a brief operation timing of the output enable signal output unit shown in FIG. 3. For the convenience of explanation, it is illustrated that "CL4" indicates that CAS latency CL is 4, "CL5" denotes that CAS latency is 5, and "CL6" indicates that CAS latency is 6.

First, an example where CAS latency CL is 4 will be described.

An initial count value of the initialization unit 330 is set to 4 based on Table 1 above. When the first reset signal RSTb_SRC is synchronized with the DLL clock signal CLK_DLL and activated to logic 'high', the DLL clock counter 340 outputs the DLL clock count value CNT_DLL<0:2> being counted from 4 that is an initial count value in response to the DLL clock signal CLK_DLL.

Meanwhile, the OE delay replica model unit 350 reflects a delay time D in the first reset signal RSTb_SRC, and synchronizes it with the external clock signal CLK_EXT to output the second reset signal RSTb_EXT. When the second reset signal RSTb_EXT is activated to logic 'high', the external clock counter 360 outputs the external clock count value CNT_EXT<0:2> being counted from 0 in response to the external clock signal CLK_EXT.

At this time, when the read command is applied and the read command signal RD_EN is activated, the count value latch 370 outputs 3 that is the external clock count value CNT_EXT<0:2> as a latched external clock count value LAT_CNT<0:2>. The count value comparator 380 compares the DLL clock count value CNT_DLL<0:2> with the latched external clock count value LAT_CNT<0:2> to activate the output enable signal OE when the two values are the same, i.e., the DLL clock count value CNT_DLL<0:2> is 3. Thus, the semiconductor memory device can output data with the output enable signal OE so activated, when the external clock signal CLK_EXT is at a point 4, as shown.

In an example where CAS latency CL is 5, an initial count value of the initialization unit 330 is set to 3 based on Table 1. When the first reset signal RSTb_SRC is activated to logic 'high', the DLL clock counter 340 outputs the DLL clock count value CNT_DLL<0:2> counted from the initial count value of 3, in response to the DLL clock signal CLK_DLL. The external clock counter 360 outputs the external clock count value CNT_EXT<0:2> counted from 0 in response to the external clock CLK_EXT.

At this time, when the read command signal RD_EN is activated, the count value latch 370 latches 3 which is the external clock count value CNT_EXT<0:2>. Then, the count value comparator 380 compares the DLL clock count value CNT_DLL<0:2> with the latched external clock count value LAT_CNT<0:2> to activate the output enable signal OE at the time the two values are the same. Thus, the semiconductor memory device can output data with the output enable signal OE so activated, when the external clock signal CLK_EXT is at a point 5, as shown.

Finally, in an example where CAS latency CL is 6, an initial count value of the initialization unit 330 is set to 2 based on Table 1. When the first reset signal RSTb_SRC is activated to logic 'high', the DLL clock counter 340 outputs the DLL clock count value CNT_DLL<0:2> being counted from the initial count value 2 in response to the DLL clock CLK_DLL. And, the external clock counter 360 starts counting clock pulses from 0 in response to the external clock CLK_EXT.

At this time, when the read command signal RD_EN is activated, the count value latch 370 latches 3 which is the external clock count value CNT_EXT<0:2>. Then, the count value comparator 380 compares the DLL clock count value CNT_DLL<0:2> with the latched external clock count value LAT_CNT<0:2> to activate the output enable signal OE at the time the two values are the same. Thus, the semiconductor memory device can output data with the output enable signal OE so activated, when the external clock signal CLK_EXT is at point 6, as shown.

As described above, the OE reset signal RSTb_OE can be outputted in synchronization with a first time by the first synchronizer 322 out of the synchronizers 320 in response to the DLL clock signal CLK_DLL, and can be outputted in synchronization with a second time slower than the first time by the second synchronizer 324 in response to the DLL clock signal CLK_DLL. That is, although the OE reset signal RSTb_OE is not synchronized with the first time, it can be synchronized with the second time, and the first reset signal RSTb_SRC can be reliably outputted in synchronization with the DLL clock signal CLK_DLL. Once the first reset signal RSTb_SRC is outputted exactly in synchronization with the DLL clock signal CLK_DLL, the output enable signal output unit can generate a desired output enable signal OE corresponding to the read command signal RD_EN and CAS latency CL.

As a result, the invention can generate a source reset signal that is reliably outputted in synchronization with an internal clock signal, thereby producing a reliable output enable signal corresponding to a read command and CAS latency.

While the present invention has been described with respect to the specific embodiments, it will be apparent to those skilled in the art that various changes and modifications may be made without departing from the spirit and scope of the invention as defined in the following claims.

What is claimed is:

1. A circuit for generating a synchronized output enable signal, comprising:
   a reset signal generator that synchronizes an external reset signal with an external clock signal to generate an output enable reset signal;
   a plurality of synchronizers for synchronizing the output enable reset signal with an internal clock signal and to generate a source reset signal; and
   an output enable signal output unit that counts pulses of the external clock signal and the internal clock signal and outputs an output enable signal corresponding to a read command and a predetermined CAS latency, wherein the output enable signal output unit is reset by the source reset signal.

2. The circuit as recited in claim 1, wherein the plurality of synchronizers include a first synchronizer for synchronizing the output enable reset signal with the internal clock signal to generate a first synchronization signal, and a second synchronizer for synchronizing the first synchronization signal output by the first synchronizer with the internal clock signal to generate the source reset signal.

3. The circuit as recited in claim 1, wherein each of the first and the second synchronizers are synchronized by the internal clock signal.

4. The circuit as recited in claim 1, wherein the output enable signal output unit includes
   an internal clock counter synchronized with the internal clock signal and starting from an initial count value corresponding to the CAS latency, wherein the internal clock counter is reset by the source reset signal;
   a delay replica model unit for delaying the source reset signal by a preset delay and generating a delay replica signal in synchronization with the external clock signal;
   an external clock counter synchronized with the external clock signal, wherein the external clock counter is reset by the delay replica signal;
   a latch for latching an external clock value output by the external clock counter in response to the read command; and
   a counting value comparator for comparing an internal clock value output by the internal clock counter with a latch value output by the latch to generate an output enable signal that is activated when the internal clock value and the latch value are equal.

5. The circuit as recited in claim 1, wherein the output enable signal is activated when the read command is input and corresponds to the CAS latency.

6. A method for generating an output enable signal, comprising:
   synchronizing an external reset signal with an external clock signal to generate an output enable reset signal;
   synchronizing the output enable reset signal to a first timing using an internal clock signal;
   synchronizing the output enable reset signal to a second timing slower than the first timing using the internal clock signal;
   generating a source reset signal based on the second timing; and
   counting pulses of the external clock signal and the internal clock signal; and
   generating an output enable signal corresponding to a read command and a predetermined CAS latency, wherein the counting is reset by the source reset signal.

7. The method as recited in claim 6, wherein said generating an output enable signal includes
   counting pulses of the internal clock signal by starting from an initial CAS count value corresponding to the CAS latency, and defining a current state of the counting of pulses of the internal clock as an internal clock value, wherein the counting is reset by the source reset signal;
   delaying the source reset signal by a preset delay;
   outputting a count reset signal in synchronization with the external clock signal;
   counting pulses of the external clock signal and defining a current state of the counting of pulses of the external clock as an external clock value, wherein the counting is reset by the count reset signal;
   latching the external clock value;
   outputting the latched external clock value in response to the read command; and comparing the latched external clock value with the internal clock value and generating the output enable signal based on a result of the comparison so as to be activated when the internal clock value and the latched external clock value are equal.

8. The method as recited in claim 6, wherein the output enable signal is activated when the read command is input and corresponds to the CAS latency.

* * * * *